US009000449B2

(12) United States Patent
Fujioka et al.

(10) Patent No.: US 9,000,449 B2
(45) Date of Patent: Apr. 7, 2015

(54) SEMICONDUCTOR SUBSTRATE, METHOD FOR PRODUCING SEMICONDUCTOR SUBSTRATE, SUBSTRATE FOR SEMICONDUCTOR GROWTH, METHOD FOR PRODUCING SUBSTRATE FOR SEMICONDUCTOR GROWTH, SEMICONDUCTOR ELEMENT, LIGHT-EMITTING ELEMENT, DISPLAY PANEL, ELECTRONIC ELEMENT, SOLAR CELL ELEMENT, AND ELECTRONIC DEVICE

(75) Inventors: Hiroshi Fujioka, Tokyo (JP); Tetsuro Hirasaki, Tokyo (JP); Hitoshi Ue, Tokyo (JP); Junya Yamashita, Tsukuba (JP); Hiroaki Hatori, Tsukuba (JP)

(73) Assignees: The University of Tokyo, Tokyo (JP); Tokai Carbon Co., Ltd., Tokyo (JP); National Institute of Advanced Industrial Science and Technology, Tokyo (JP)

( * ) Notice: Subject to any disclaimer, the term of this patent is extended or adjusted under 35 U.S.C. 154(b) by 211 days.

(21) Appl. No.: 13/394,282
(22) PCT Filed: Sep. 7, 2010
(86) PCT No.: PCT/JP2010/065309
§ 371 (c)(1),
(2), (4) Date: Apr. 17, 2012
(87) PCT Pub. No.: WO2011/027894
PCT Pub. Date: Mar. 10, 2011

(65) Prior Publication Data
US 2012/0187422 A1      Jul. 26, 2012

(30) Foreign Application Priority Data
Sep. 7, 2009   (JP) ................. 2009-206438

(51) Int. Cl.
*H01L 29/26*   (2006.01)
*H01L 21/02*   (2006.01)
(Continued)

(52) U.S. Cl.
CPC ...... *H01L 21/0262* (2013.01); *H01L 21/02444* (2013.01); *H01L 21/02458* (2013.01);
(Continued)

(58) Field of Classification Search
USPC ............ 257/79, 615, 627, E29.089, E29.004, 257/E21.09; 438/496, 497, 781
See application file for complete search history.

(56) References Cited

U.S. PATENT DOCUMENTS 3,792,024 A       2/1974  Lowell Saferstein
3,985,679 A  * 10/1976  Taylor et al. ................. 502/159
(Continued)

FOREIGN PATENT DOCUMENTS

JP       5-170536 A     7/1993
JP       9-285722 A    11/1997
(Continued)

OTHER PUBLICATIONS

Chinese Office Action dated Jan. 24, 2014, issued in corresponding Chinese application No. 201080039838.1, w/English translation (13 pages).
(Continued)

*Primary Examiner* — Su C Kim
(74) *Attorney, Agent, or Firm* — Westerman, Hattori, Daniels & Adrian, LLP

(57) ABSTRACT

A semiconductor substrate that includes a semiconductor layer that exhibits high crystallinity includes a graphite layer formed of a heterocyclic polymer obtained by condensing an aromatic tetracarboxylic acid and an aromatic tetramine, and a semiconductor layer that is grown on the surface of the graphite layer, or includes a substrate that includes a graphite layer formed of a heterocyclic polymer obtained by condensing an aromatic tetracarboxylic acid and an aromatic tetramine on its surface, a buffer layer that is grown on the surface of the graphite layer, and a semiconductor layer that is grown on the surface of the buffer layer.

29 Claims, 11 Drawing Sheets

(51) Int. Cl.
 *H01L 33/12* (2010.01)
 *H01L 33/00* (2010.01)
 *H01L 33/32* (2010.01)

(52) U.S. Cl.
 CPC .... *H01L21/02488* (2013.01); *H01L 21/02502* (2013.01); *H01L 21/02516* (2013.01); *H01L 21/02532* (2013.01); *H01L 21/02538* (2013.01); *H01L 33/12* (2013.01); *H01L 33/007* (2013.01); *H01L 33/32* (2013.01); *H01L 2924/0002* (2013.01)

(56) References Cited

U.S. PATENT DOCUMENTS

| | | | |
|---|---|---|---|
| 5,352,524 | A | 10/1994 | Nagata |
| 5,443,859 | A | 8/1995 | Nagata |
| 2006/0033225 | A1 | 2/2006 | Wang |
| 2006/0033226 | A1 | 2/2006 | Wang |
| 2009/0136809 | A1 | 5/2009 | Wang |
| 2009/0220722 | A1 | 9/2009 | Wang |
| 2009/0220826 | A1 | 9/2009 | Wang |
| 2010/0320450 | A1 | 12/2010 | Fujioka |

FOREIGN PATENT DOCUMENTS

| | | | |
|---|---|---|---|
| JP | 2008-509876 | A | 4/2008 |
| JP | 2009-200207 | * | 3/2009 |
| WO | 2006/023419 | A1 | 3/2006 |
| WO | 2009/104759 | A1 | 8/2009 |

OTHER PUBLICATIONS

Yamashita, Jun'ya et al., 'Benzimidazobenzophenanthroline ladder polymer o Shuppatsu Busshitsu to suru Tanso Film no Kozo to Bussei, Abstracts of Annual Meeting of the Carbon Society of Japan, Nov. 2008, p. 280-281, vol. 35.

Yamashita, Jun'ya et al., 'Benzimidazobenzophenanthroline ladder polymer o Shuppatsu Busshitsu to suru Kokesshose Tanso Filmi, Abstracts of Annual Meeting of the Carbon Society of Japan, Nov. 2007, p. 314-315, vol. 34.

Irie, Kyohei et al., "HfN Buffer-so o Mochiita Kobunshi Netsu Bunkai Graphite Sheet-jo eno GaN no Seicho", Dai 69 Extended abstracts; the Japan Society of Applied Physics, Sep. 2008, p. 304-3a-CG-6, vol. 69.

Irie, Kyohei et al., "Kobunshi Netsu Bunkai Graphite Sheet-jo eno III-zoku Chikkabutsu Usumaku no Seicho", Dai 55 Extended abstracts; the Japan Society of Applied Physics and Related Societies, Mar. 2008, p. 386-28a-B-6, vol. 55.

Inada, Nariyuki, "Manufacturing of high-quality Semi-conductor thin film at room temperature", Nikkei Nano Business Emerging Tech, 2006, p. 34-35, vol. 40.

International Search Report of PCT/JP2010/065309, mailing date Nov. 30, 2010.

Japanese Office Action dated Feb. 12, 2014, issued in corresponding Japanese Patent Application No. 2009-206438, w/English translation (12 pages).

Extended European Search Report dated Dec. 2, 2014, issued in corresponding European Application No. 10813840-5. (12 pages).

* cited by examiner (a)

(b)

(c)

(d)

(a)

(b)

| Wavelength (nm) | 350 | 400 | 450 | 470 (Blue) | 500 | 550 | 600 | 650 |
|---|---|---|---|---|---|---|---|---|
| Reflectivity of ZrN | 7.8% | 29.1% | 60.0% | 65.6% | 71.9% | 78.4% | 82.8% | 85.6% |

Contour constant scale relative strength

SEMICONDUCTOR SUBSTRATE, METHOD FOR PRODUCING SEMICONDUCTOR SUBSTRATE, SUBSTRATE FOR SEMICONDUCTOR GROWTH, METHOD FOR PRODUCING SUBSTRATE FOR SEMICONDUCTOR GROWTH, SEMICONDUCTOR ELEMENT, LIGHT-EMITTING ELEMENT, DISPLAY PANEL, ELECTRONIC ELEMENT, SOLAR CELL ELEMENT, AND ELECTRONIC DEVICE

TECHNICAL FIELD

The invention relates to a semiconductor substrate, a method of producing a semiconductor substrate, a semiconductor growth substrate, a method of producing a semiconductor growth substrate, a semiconductor device, a light-emitting device, a display panel, an electronic device, a solar cell device, and an electronic instrument.

BACKGROUND ART

A semiconductor device that utilizes a semiconductor material such as silicon or a nitride semiconductor material (group 13 nitride (AlN, GaN, or InN) or a mixed crystal thereof) that forms a PN junction has been widely put to practical use. A semiconductor device has been generally produced on an expensive single-crystal substrate (e.g., sapphire or silicon carbide) by a method with low mass productivity. Therefore, such an expensive semiconductor device has been used as a point light source instead of a surface light source.

An organic EL device has been known as a surface light source (see Non-patent Document 1, for example). Since the organic EL device can be produced using an inexpensive plastic substrate or glass, the organic EL device is inexpensive, and can be used as a surface light source. The organic EL device is expected to be used as a flexible light-emitting device or illumination device.

It has been proposed to form a semiconductor layer on a graphite substrate that exhibits heat resistance, and exhibits flexibility when an external force is applied. A graphite film that is obtained by heating a polymer (e.g., polyimide or POD) at a high temperature and has c-axis orientation has been proposed as the graphite substrate.

RELATED-ART DOCUMENT

Non-Patent Document

Non-patent Document 1: Nikkei Nano Business, 2006, No. 40, pp. 34-35

SUMMARY OF THE INVENTION

Problems to be Solved by the Invention

However, a graphite sheet produced using a polymer as the starting material does not necessarily exhibit sufficient crystallinity, and a semiconductor layer formed on the graphite sheet also does not necessarily exhibit sufficient crystallinity.

In view of the above situation, an object of the invention is to provide a semiconductor substrate that includes a semiconductor layer that exhibits high crystallinity, a method of producing a semiconductor substrate, a semiconductor growth substrate, a method of producing a semiconductor growth substrate, a semiconductor device, a light-emitting device, a display panel, an electronic device, a solar cell device, and an electronic instrument.

Means for Solving the Problems

According to one aspect of the invention, a semiconductor substrate includes:

a substrate that includes a graphite layer, the graphite layer forming a surface of the substrate, and being formed of a heterocyclic polymer obtained by condensing an aromatic tetracarboxylic acid and an aromatic tetramine; and a semiconductor layer that is grown on a surface of the graphite layer.

The graphite layer formed of a heterocyclic polymer obtained by condensing an aromatic tetracarboxylic acid and an aromatic tetramine exhibits excellent crystallinity. The semiconductor layer that is grown on the surface of the graphite layer also exhibits excellent crystallinity. A semiconductor substrate that includes a semiconductor layer that exhibits excellent crystallinity can thus be obtained.

According to another aspect of the invention, a semiconductor substrate includes:

a substrate that includes a graphite layer, the graphite layer forming a surface of the substrate, and being formed of a heterocyclic polymer obtained by condensing an aromatic tetracarboxylic acid and an aromatic tetramine;

a buffer layer that is grown on a surface of the graphite layer; and a semiconductor layer that is grown on a surface of the buffer layer.

The graphite layer formed of a heterocyclic polymer obtained by condensing an aromatic tetracarboxylic acid and an aromatic tetramine exhibits excellent crystallinity. The buffer layer that is grown on the surface of the graphite layer, and the semiconductor layer that is grown on the surface of the buffer layer also exhibit excellent crystallinity. A semiconductor substrate that includes a semiconductor layer that exhibits excellent crystallinity can thus be obtained.

The buffer layer may include at least one of HfN, ZrN, and AlN.

When the buffer layer that includes at least one of HfN, ZrN, and AlN is provided between the graphite substrate and the semiconductor layer, light can be reflected by the buffer layer. For example, when using the semiconductor layer as a light-absorbing layer, the light absorption efficiency of the light-absorbing layer can be improved. When using the semiconductor layer as an emitting layer, the utilization efficiency of light emitted from the emitting layer can be improved. When the buffer layer includes AlN, the grain size of the semiconductor layer can be increased. This makes it possible to improve the electrical properties of the semiconductor layer. When using the semiconductor layer as an emitting layer, it is possible to improve the optical properties of the semiconductor layer.

The buffer layer may include a plurality of layers.

For example, an HfN/ZrN layer that reflects light and an AlN layer that increases the grain size may be separately formed as the buffer layer.

The semiconductor layer may be formed of a semiconductor that includes silicon or a group 13 nitride.

In this case, a highly crystalline semiconductor layer that includes a semiconductor that includes silicon or a group 13 nitride can be obtained.

The graphite layer may have a (0001) surface, and the semiconductor layer may be grown on the (0001) surface.

When the graphite layer has a (0001) surface, and the semiconductor layer is grown on the (0001) surface, the orientation of the semiconductor layer can be improved.

The substrate may include a base that includes an organic compound that differs from the heterocyclic polymer, and the graphite layer that is provided on the base.

A semiconductor layer that exhibits high crystallinity can be obtained even if the entire substrate is not the graphite layer. The crystallinity of the semiconductor layer can be improved by merely causing the semiconductor layer to grow on the surface of the graphite layer. An inexpensive semiconductor substrate can be produced by providing the graphite layer on the base that includes an organic compound that differs from the heterocyclic polymer.

According to another aspect of the invention, a method of producing a semiconductor substrate includes causing a semiconductor layer to grow on a surface of a graphite layer that forms a surface of a substrate, the graphite layer being formed of a heterocyclic polymer obtained by condensing an aromatic tetracarboxylic acid and an aromatic tetramine.

Since the semiconductor layer is grown on the surface of the highly crystalline graphite layer that is formed of a heterocyclic polymer obtained by condensing an aromatic tetracarboxylic acid and an aromatic tetramine, the semiconductor layer exhibits excellent crystallinity due to the excellent crystallinity of the graphite layer (i.e., a semiconductor layer that exhibits excellent crystallinity can be obtained). A semiconductor substrate that includes a semiconductor layer that exhibits excellent crystallinity can thus be obtained.

According to another aspect of the invention, a method of producing a semiconductor substrate includes causing a buffer layer to grow on a surface of a graphite layer that forms a surface of a substrate, and causing a semiconductor layer to grow on a surface of the buffer layer, the graphite layer being formed of a heterocyclic polymer obtained by condensing an aromatic tetracarboxylic acid and an aromatic tetramine.

Since the buffer layer is grown on the surface of the highly crystalline graphite layer that is formed of a heterocyclic polymer obtained by condensing an aromatic tetracarboxylic acid and an aromatic tetramine, and the semiconductor layer is grown on the surface of the buffer layer, the buffer layer and the semiconductor layer exhibit excellent crystallinity due to the excellent crystallinity of the graphite layer (i.e., a semiconductor layer that exhibits excellent crystallinity can be obtained). A semiconductor substrate that includes a semiconductor layer that exhibits excellent crystallinity can thus be obtained.

The method may include causing a layer that includes at least one of HfN, ZrN, and AlN to grow as the buffer layer.

When the buffer layer that includes at least one of HfN, ZrN, and AlN is provided between the graphite substrate and the semiconductor layer, light can be reflected by the buffer layer. For example, when using the semiconductor layer as a light-absorbing layer, a semiconductor substrate in which the light absorption efficiency of the light-absorbing layer is improved can be obtained. When using the semiconductor layer as an emitting layer, a semiconductor substrate in which the utilization efficiency of light emitted from the emitting layer is improved can be obtained. When the buffer layer includes AlN, the grain size of the semiconductor layer can be increased. This makes it possible to obtain a semiconductor substrate that exhibits improved electrical properties. When using the semiconductor layer as an emitting layer, it is possible to obtain a semiconductor substrate that exhibits improved optical properties.

The method may include forming a plurality of layers as the buffer layer.

For example, an HfN/ZrN layer that reflects light and an AlN layer that increases the grain size may be separately formed as the buffer layer.

The method may include causing a semiconductor layer that includes silicon or a group 13 nitride to grow as the semiconductor layer.

In this case, a semiconductor substrate that includes a highly crystalline semiconductor layer that includes a semiconductor that includes silicon or a group 13 nitride can be obtained.

The (0001) surface may have a (0001) surface, and the method may include causing the semiconductor layer to grow on the (0001) surface.

When the graphite layer has a (0001) surface, and the semiconductor layer is grown on the (0001) surface, a semiconductor substrate that includes a semiconductor layer that exhibits improved orientation can be obtained.

The method may include forming the graphite layer on a base that is formed of an organic compound that differs from the heterocyclic polymer to obtain the substrate.

The substrate can be produced at low cost by forming the graphite layer on the base that is formed of an organic compound that differs from the heterocyclic polymer to obtain the substrate.

The method may include dissolving the heterocyclic polymer in a solvent to obtain a solution of the heterocyclic polymer, applying the solution to the base to form a thin film, and heating the thin film and the base at 2000 to 3000° C. to obtain the substrate.

A substrate that includes a graphite layer that exhibits high crystallinity can be produced at low cost by dissolving the heterocyclic polymer in a solvent to obtain a solution of the heterocyclic polymer, applying the solution to the base to form a thin film, and heating the thin film and the base at 2000 to 3000° C. to obtain the substrate.

The method may include forming a layer of the heterocyclic polymer on a free-standing base, and separating the layer of the heterocyclic polymer from the free-standing base to obtain the graphite layer.

A graphite layer that exhibits high crystallinity can be obtained as the substrate by forming a layer of the heterocyclic polymer on a free-standing base, and separating the layer of the heterocyclic polymer from the free-standing base to obtain the graphite layer.

The method may include forming the graphite layer so that the graphite layer has a coefficient of thermal expansion corresponding to a coefficient of thermal expansion of a layer that is grown on a surface of the graphite layer.

It is possible to prevent occurrence of defects in the subsequent heat treatment due to the difference in coefficient of thermal expansion by forming the graphite layer so that the graphite layer has a coefficient of thermal expansion equal to or almost equal to the coefficient of thermal expansion of a layer that is grown on the surface of the graphite layer.

According to another aspect of the invention, a semiconductor growth substrate includes a graphite layer that forms a surface of the semiconductor growth substrate, the graphite layer being formed of a heterocyclic polymer obtained by condensing an aromatic tetracarboxylic acid and an aromatic tetramine.

When the semiconductor growth substrate includes the graphite layer that forms the surface of the semiconductor growth substrate and is formed of a heterocyclic polymer obtained by condensing an aromatic tetracarboxylic acid and an aromatic tetramine, a semiconductor layer that exhibits excellent crystallinity can be grown on the surface of the semiconductor growth substrate.

The graphite layer may have a (0001) surface.

When the graphite layer has a (0001) surface, a semiconductor layer can be grown on the (0001) surface. Therefore, a semiconductor layer that exhibits improved orientation can be grown.

The graphite layer may be formed on a base that is formed of an organic compound that differs from the heterocyclic polymer.

The semiconductor growth substrate can be produced at low cost by forming the graphite layer on the base that is formed of an organic compound that differs from the heterocyclic polymer.

According to another aspect of the invention, a method of producing a semiconductor growth substrate includes forming a graphite layer on a base, the graphite layer being formed of a heterocyclic polymer obtained by condensing an aromatic tetracarboxylic acid and an aromatic tetramine, and the base being formed of an organic compound that differs from the heterocyclic polymer.

The semiconductor growth substrate can be produced at low cost by forming the graphite layer that exhibits excellent crystallinity and is formed of a heterocyclic polymer obtained by condensing an aromatic tetracarboxylic acid and an aromatic tetramine on the base.

The method may include dissolving the heterocyclic polymer in a solvent to obtain a solution of the heterocyclic polymer, applying the solution to the base to form a thin film, and heating the thin film and the base at 2000 to 3000° C. to obtain the semiconductor growth substrate.

A semiconductor growth substrate that includes a graphite layer that exhibits high crystallinity can be produced at low cost by dissolving the heterocyclic polymer in a solvent to obtain a solution of the heterocyclic polymer, applying the solution to the base to form a thin film, and heating the thin film and the base at 2000 to 3000° C. to obtain the semiconductor growth substrate.

According to another aspect of the invention, a method of producing a semiconductor growth substrate includes forming a layer of a heterocyclic polymer obtained by condensing an aromatic tetracarboxylic acid and an aromatic tetramine on a free-standing base, and separating the layer of the heterocyclic polymer from the free-standing base to obtain a graphite layer.

A graphite layer that exhibits high crystallinity can be obtained as the semiconductor growth substrate by forming a layer of the heterocyclic polymer on a free-standing base, and separating the layer of the heterocyclic polymer from the free-standing base to obtain the graphite layer.

The method may include forming the graphite layer so that the graphite layer has a coefficient of thermal expansion corresponding to a coefficient of thermal expansion of a layer that is grown on a surface of the graphite layer.

It is possible to prevent occurrence of defects in the subsequent heat treatment due to the difference in coefficient of thermal expansion by forming the graphite layer so that the graphite layer has a coefficient of thermal expansion equal to or almost equal to the coefficient of thermal expansion of a layer that is grown on the surface of the graphite layer.

According to another aspect of the invention, a semiconductor device includes the semiconductor substrate according to one aspect of the invention.

The semiconductor device exhibits excellent properties due to the semiconductor substrate that includes the semiconductor layer that exhibits excellent crystallinity.

According to another aspect of the invention, a light-emitting device includes the semiconductor device according to one aspect of the invention.

The light-emitting device exhibits excellent emitting properties due to the semiconductor device that exhibits excellent properties.

According to another aspect of the invention, a display panel includes the light-emitting device according to one aspect of the invention.

The display panel exhibits excellent display performance due to the light-emitting device that exhibits excellent emitting properties.

According to another aspect of the invention, an electronic device includes the semiconductor device according to one aspect of the invention.

The electronic device exhibits excellent electrical properties due to the semiconductor device that exhibits excellent properties.

According to another aspect of the invention, a solar cell device includes the semiconductor substrate according to one aspect of the invention.

The solar cell device exhibits excellent properties due to the semiconductor substrate that includes the semiconductor layer that exhibits excellent crystallinity.

According to a further aspect of the invention, an electronic instrument includes at least one of the semiconductor device according to one aspect of the invention, the light-emitting device according to one aspect of the invention, the display panel according to one aspect of the invention, the electronic device according to one aspect of the invention, and the solar cell device according to one aspect of the invention.

The electronic instrument exhibits excellent properties since the electronic instrument includes at least one of the semiconductor device according to one aspect of the invention, the light-emitting device according to one aspect of the invention, the display panel according to one aspect of the invention, the electronic device according to one aspect of the invention, and the solar cell device according to one aspect of the invention.

Effects of the Invention

The invention thus provides a semiconductor substrate that includes a semiconductor layer that exhibits high crystallinity, a method of producing a semiconductor substrate, a semiconductor growth substrate, a method of producing a semiconductor growth substrate, a semiconductor device, a light-emitting device, a display panel, an electronic device, a solar cell device, and an electronic instrument.

DESCRIPTION OF EXEMPLARY EMBODIMENTS

A first embodiment of the invention is described below with reference to the drawings.

Figure 1:
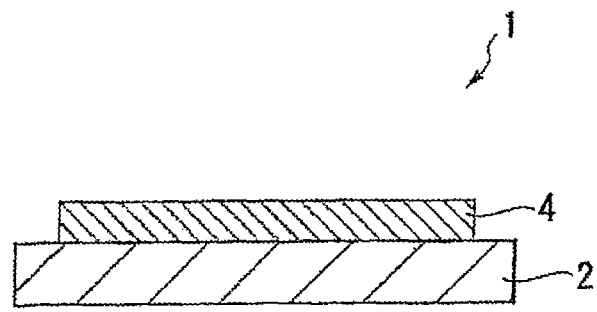
FIG. 1 is a view showing the configuration of a semiconductor substrate according to a first embodiment of the invention.

FIG. 1 is a view showing the configuration of a semiconductor substrate 1 according to the first embodiment.

As shown in FIG. 1, the semiconductor substrate 1 includes a graphite substrate 2, and a semiconductor layer 4 that is stacked on the graphite substrate 2. The semiconductor substrate 1 is provided in a light-emitting device, an electronic device, or the like.

The graphite substrate 2 is formed of a graphite film that includes a heterocyclic polymer obtained by condensing an aromatic tetracarboxylic acid and an aromatic tetramine. Examples of the heterocyclic polymer include a polyimide polymer, a benzimidazobenzophenanthroline ladder (BBL) polymer, a polyoxadiazole polymer, a polyparaphenylenevinylene polymer, a BNTCA-BPTA polymer, and the like. Specific examples of the heterocyclic polymer include a polymer that includes a repeating unit shown by the following general formula (1), and has an intrinsic viscosity of 0.5 to 3.5 dlg$^{-1}$.

It is preferable that the polymer that includes the repeating unit shown by the general formula (1) have an intrinsic viscosity of 1.0 to 3.5 dlg$^{-1}$. The intrinsic viscosity (ii) of a polymer is an index of the molecular weight. Specifically, the intrinsic viscosity (ii) increases as the molecular weight increases. The term "intrinsic viscosity" used herein refers to a value obtained by dissolving the polymer in methanesulfonic acid at a concentration of 0.15 gdl$^{-1}$, and measuring the intrinsic viscosity of the solution at 30° C.

(1)

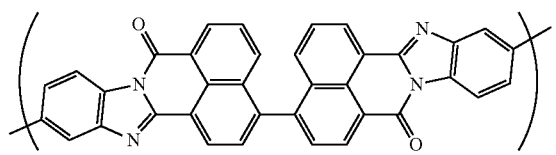

The polymer that includes the repeating unit shown by the general formula (1) may be obtained by reacting a binaphthyltetracarboxylic acid or a derivative (e.g., acid chloride, acid anhydride, ester, or amide) thereof with a biphenyltetramine or a salt thereof. Examples of the binaphthyltetracarboxylic acid include 4,4'-binaphthyl-1,1',8,8'-tetracarboxylic acid. Examples of the biphenyltetramine include 3,3',4,4'-biphenyltetramine. Examples of a salt of the biphenyltetramine include 3,3',4,4'-biphenyltetramine tetrahydrochloride.

The polymer that includes the repeating unit shown by the general formula (1) may be obtained by charging a reaction vessel that contains a solvent with the binaphthyltetracarboxylic acid or a derivative thereof and the biphenyltetramine or a salt thereof, and stirring the mixture at 100 to 250° C. for 3 to 48 hours. The solvent is not particularly limited as long as the solvent dissolves the starting materials and the resulting polymer, and functions as a catalyst that promotes polymerization. Specific examples of the solvent include methanesulfonic acid and the like in which polyphosphoric acid, a polyphosphate, diphenyl cresyl phosphate, phosphorus pentoxide, or the like is dissolved.

Specific examples of the heterocyclic polymer also include a polymer that includes a repeating unit shown by the following general formula (2), and has an intrinsic viscosity of 0.5 to 3.5 dlg$^{-1}$.

(2)

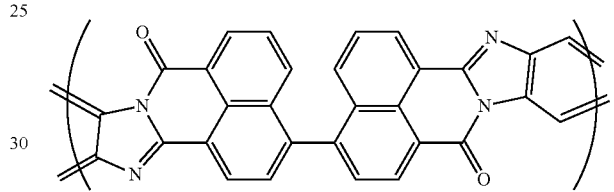

It is preferable that the polymer that includes the repeating unit shown by the general formula (2) have an intrinsic viscosity of 1.0 to 2.7 dlg$^{-1}$. The polymer that includes the repeating unit shown by the general formula (2) may be obtained by reacting a binaphthyltetracarboxylic acid or a derivative (e.g., acid chloride, acid anhydride, ester, or amide) thereof with a benzenetetramine or a salt thereof. Examples of the benzenetetramine include 1,2,4,5-benzenetetramine. Examples of a salt of the benzenetetramine include 1,2,4,5-benzenetetramine tetrahydrochloride. Specific examples of the binaphthyltetracarboxylic acid or a acid derivative thereof include those mentioned above.

The polymer that includes the repeating unit shown by the general formula (2) may be obtained by reacting the binaphthyltetracarboxylic acid or a derivative thereof with the benzenetetramine or a salt thereof under the same conditions as those mentioned above in connection with the polymer that includes the repeating unit shown by the general formula (1).

Specific examples of the heterocyclic polymer also include a polymer that includes a repeating unit shown by the following general formula (3), and has an intrinsic viscosity of 0.5 to 3.5 dlg$^{-1}$.

(3)

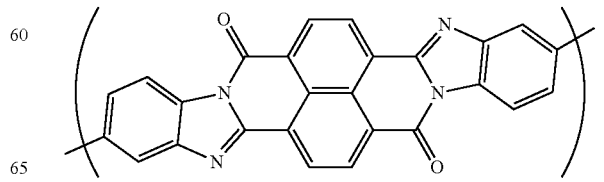

It is preferable that the polymer that includes the repeating unit shown by the general formula (3) have an intrinsic viscosity of 1.0 to 2.2 dlg$^{-1}$.

The polymer that includes the repeating unit shown by the general formula (3) may be obtained by reacting a naphthalenetetracarboxylic acid or a derivative (e.g., acid chloride, acid anhydride, ester, or amide) thereof with a biphenyltetramine or a salt thereof. Examples of the naphthalenetetracarboxylic acid include 1,4,5,8-naphthalenetetracarboxylic acid. Specific examples of the biphenyltetramine or a salt thereof include those mentioned above.

The polymer that includes the repeating unit shown by the general formula (3) may be obtained by reacting the naphthalenetetracarboxylic acid or a derivative thereof with the biphenyltetramine or a salt thereof under the same conditions as those mentioned above in connection with the polymer that includes the repeating unit shown by the general formula (1).

4,4'-Binaphthyl-1,1',8,8'-tetracarboxylic acid may be synthesized from 4-chloro-1,8-naphthalic anhydride via esterification, coupling, and hydrolysis. A commercially available product may also be used.

1,4,5,8-Naphthalenetetracarboxylic acid may be synthesized from pyrene via oxidation using potassium permanganate and oxidation using a sodium hypochlorite solution. A commercially available product may also be used.

1,2,4,5-Benzenetetramine may be synthesized from m-chlorobenzene via nitration, amination, and reduction of the nitro group, and may be isolated as a tetrahydrochloride. A commercially available product may also be used.

3,3',4,4'-Biphenyltetramine may be synthesized from o-nitroaniline via iodination, cross-coupling, and reduction of the amino group. A commercially available product may also be used.

A carbon film may be obtained using at least one polymer selected from the polymer that includes the repeating unit shown by the general formula (1), the polymer that includes the repeating unit shown by the general formula (2), and the polymer that includes the repeating unit shown by the general formula (3). Specifically, the invention also relates to a carbon film-producing polymer that includes the repeating unit shown by the general formula (1), the repeating unit shown by the general formula (2), or the repeating unit shown by the general formula (3).

The heterocyclic polymer according to the first embodiment may be defined as follows.

(1) A polymer shown by the following general formula, and having an intrinsic viscosity of 0.5 to 3.5 dlg$^{-1}$.

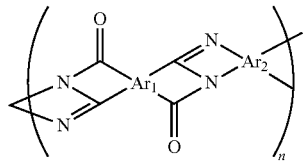

wherein Ar$^1$ represents the following functional group 1 or 2, Ar$^2$ represents the following functional group 3 or 4, and n is a natural number that indicates the degree of polymerization, provided that Ar$^2$ does not represent the functional group 4 when Ar$^1$ represents the functional group 2.

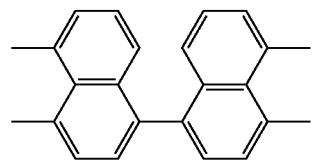
(Functional group 1)

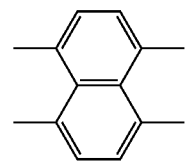
(Functional group 2)

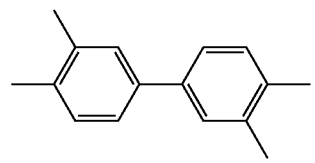
(Functional group 3)

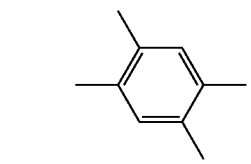
(Functional group 4)

(2) A polymer shown by the following general formula (4), (5), or (6), and having an intrinsic viscosity of 0.5 to 3.5 dlg$^{-1}$. Note that n in the general formulas (4), (5), and (6) is a natural number.

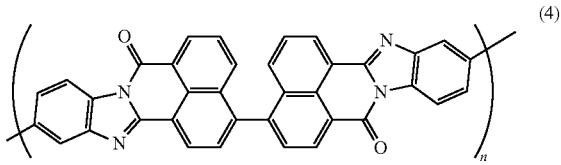
(4)

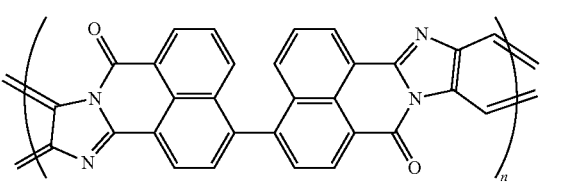
(5)

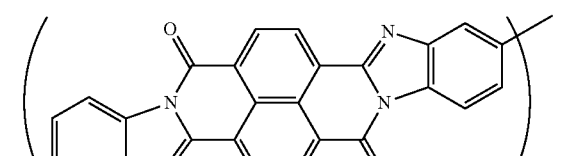
(6)

The graphite substrate 2 shown in FIG. 1 may be formed to have a thickness of 10 to 100 μm, for example. When the thickness of the graphite substrate 2 is 100 μm or less, the graphite substrate 2 exhibits flexibility when an the external force is applied. Specifically, the graphite substrate 2 can be bent. When the thickness of the graphite substrate 2 is 10 μm or more, the graphite substrate 2 rarely breaks when an the external force is applied. The thickness of the graphite substrate 2 is preferably 25 to 100 μm. In this case, breakage of the graphite substrate 2 can be reliably prevented. The graphite sheet 2 can be formed to have an area as large as 50 cm$^2$ or more. When the semiconductor substrate 1 includes a buffer layer, the graphite substrate 2 is formed so that a (0001) surface comes in contact with the buffer layer (3) (not shown).

Figure 2:
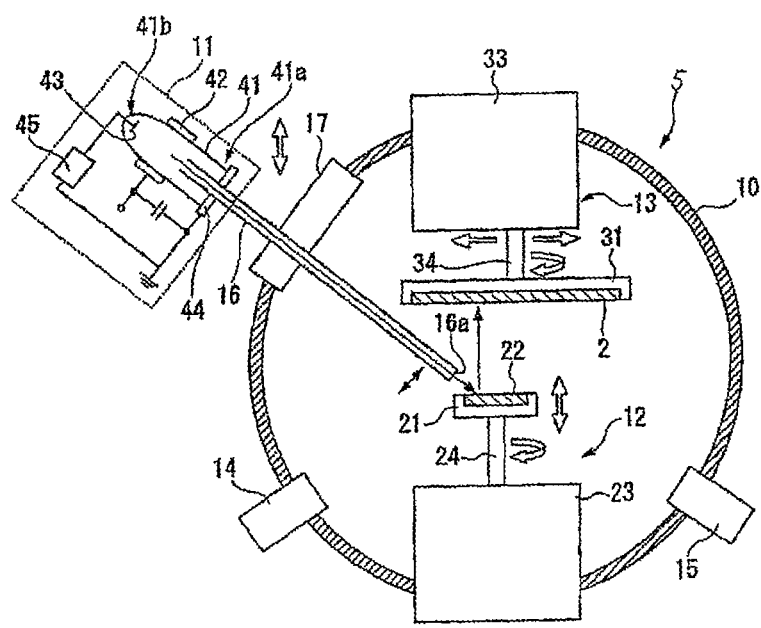
FIG. 2 is a view showing a schematic configuration of a pulsed electron beam deposition (PED) system according to the first embodiment.

FIG. 2 is a view showing a schematic configuration of a PED system 5 according to the first embodiment.

As shown in FIG. 2, the PED system 5 includes a chamber 10, an electron beam source 11, a target holding-driving section 12, a substrate holding section 13, a gas supply section 14, and a pressure regulation section 15. The PED system 5 vaporizes the target substance by applying electron beams. The following description is given taking an example in which a group 13 nitride semiconductor is formed on the substrate. Examples of the group 13 nitride semiconductor include GaN, AlN, InN, and the like. The group 13 nitride semiconductor is shown by $In_XGa_YAl_{1-X-Y}N$ (wherein $0 \leq X \leq 1$, $0 \leq Y \leq 1$, and $0 \leq X+Y \leq 1$).

The electron beam source 11 is provided outside the chamber 10, and includes a discharge tube 41, a hollow cathode 42, a trigger electrode 43, an opposite electrode 44, and a pulse generator 45. The discharge tube 41 is formed of glass or the like, and is configured so that an end 41a in the longitudinal direction is open. The hollow cathode 42 is secured on the outer side of the discharge tube 41 so that an electric field can be formed in the discharge tube 41. The trigger electrode 43 is provided in the discharge tube 41 on the other end 41b of the discharge tube 41 in the longitudinal direction. The opposite electrode 44 is provided on the end 41a of the discharge tube 41. The pulse generator 45 is electrically connected to the trigger electrode 43, and supplies a pulse signal to the trigger electrode 43 at a given frequency. The electron beam source 11 causes a channel spark discharge in the discharge tube 41 by utilizing the above mechanism, and discharges the generated pulsed electron beams through the end 41a.

A ceramic tube 16 that guides the pulsed electron beams is attached to the end 41a of the discharge tube 41. The chamber 10 is provided with a window 17. The ceramic tube 16 is inserted into the chamber 10 through the window 17 to reach the target holding-driving section 12. An opening (discharge section) 16a is formed on one end of the ceramic tube 16, and pulsed electron beams that have been generated in the discharge tube 41 and guided by the ceramic tube 16 are discharged through the opening 16a. The inner diameter of the ceramic tube 16 is about 2 to 4 mm. The ceramic tube 16 is provided with a moving mechanism (not shown) so that the opening 16a of the ceramic tube 16 can be moved.

The target holding-driving section 12 includes a target holding section 21, a target driving section 23, and a target driving shaft 24. The target holding section 21 is a crucible that is provided to horizontally hold a target 22. A heating mechanism (e.g., heating wire) (not shown) is provided in the target holding section 21 so that the target 22 can be heated.

The target holding section 21 is formed of a material that exhibits conductivity. Examples of the material for forming the target holding section 21 include group 13 nitrides such as boron nitride (BN), gallium nitride (GaN), indium nitride (InN), and aluminum nitride (AlN) to which a metal such as titanium (Ti) is added.

Examples of the target 22 include group 13 metals (e.g., Al, Ga, In, and a mixture thereof), group 13 nitrides (e.g., AlN, GaN, and InN), and the like. Ga is liquid at 30° C.

The target driving section 23 can move the target holding section 21 upward and downward via the target driving shaft 24, and can rotate the target holding section 21 around the target driving shaft 24.

The substrate holding section 13 includes a substrate holder 31, a substrate holder driving section 33, and a substrate holder driving shaft 34. The substrate holder 31 can horizontally hold the substrate 2. A heating mechanism (e.g., heating wire) (not shown) is provided in the substrate holder 31 so that the substrate 2 can be heated.

The substrate holder driving section 33 can move the substrate holder 31 rightward and leftward via the substrate holder driving shaft 34, and can rotate the substrate holder 31 around the substrate holder driving shaft 34. The gas supply section 14 supplies a group 15 gas (e.g., nitrogen gas) to the chamber 10. The pressure regulation section 15 is a pump or the like, and can regulate the pressure inside the chamber 10.

The graphite substrate 2 is formed as described below. A polymer (or a mixture of polymers) selected from the polymer that includes the repeating unit shown by the general formula (1), the polymer that includes the repeating unit shown by the general formula (2), and the polymer that includes the repeating unit shown by the general formula (3) is dissolved in an acidic liquid or dispersed in a dispersion medium to obtain a polymer liquid 7. The polymer liquid 7 is applied to a free-standing substrate 6 (see FIG. 3(a)). The polymer liquid 7 is applied by a spin coating method, a dispensing method, or the like.

Figure 3:
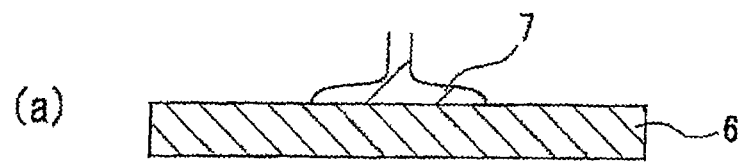
FIG. 3 is a view showing a process for producing the semiconductor substrate according to the first embodiment.
Figure 3:
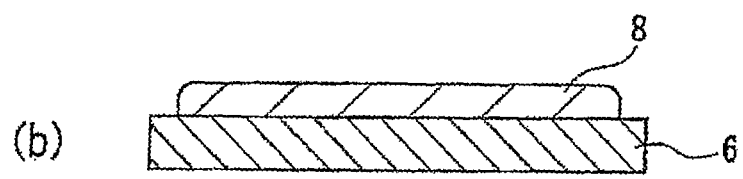
Figure 3:
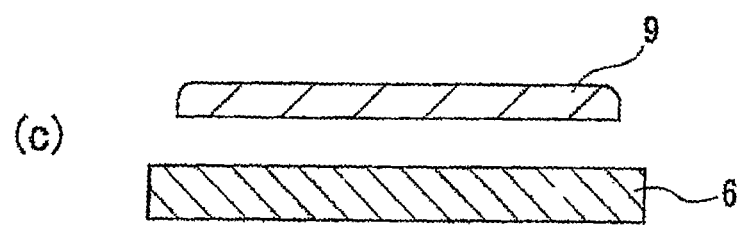
Figure 3:

The liquid or the dispersion medium is evaporated from the polymer liquid 7, and a residue 8 and the free-standing substrate 6 are fired (baked) in an inert atmosphere (see FIG. 3(b)). The calcining temperature is preferably about 1000 to about 3000° C., and more preferably about 1200 to about 2800° C. The calcining time is preferably about 1 to about 8 hours. Note that the term "inert atmosphere" used herein refers to an atmosphere that does not contain an oxidizing gas (e.g., oxygen). An argon atmosphere, a helium atmosphere, a nitrogen atmosphere, or the like is preferable as the inert atmosphere. Among these, an argon atmosphere is particularly preferable.

It is preferable to fire the residue 8 and the free-standing substrate 6 while applying tension to the residue 8, or applying a pressure to the surface of the residue 8 in the vertical direction. This suppresses shrinkage that may occur during carbonization, so that the precursor is easily oriented during carbonization. As a result, a carbide that exhibits high strength can be obtained. Since the polymer molecules spontaneously form a highly oriented structure when the residue 8 is fired, a highly crystalline carbon film can be produced without applying a stress. A graphite sheet 9 having a coefficient of thermal expansion close to the desired value can be obtained by adjusting the calcining conditions. For example, the calcining conditions may be adjusted so that the graphite sheet 9 has almost the same coefficient of thermal expansion as that of the semiconductor layer 4 formed on the graphite substrate 2.

The graphite sheet 9 formed by calcining is removed from the free-standing substrate 6 (see FIG. 3(c)).

After removing the graphite sheet 9, the peripheral area of the graphite sheet 9 is cut (see FIG. 3(d)). The graphite substrate 2 is thus obtained.

It is preferable to form a film in advance using the polymer or the polymer mixture, and fire the resulting film. The film may be formed by an arbitrary method using the polymer or the polymer mixture.

The graphite substrate 2 is a highly crystalline carbon film having high density.

The density of a pure carbon crystal calculated from the crystal structure is 2.26 g/cm$^{-3}$. A carbon film exhibits high crystallinity when the density is close to 2.26 g/cm$^{-3}$. The density of a carbon film obtained using a BBL polymer is 2.19 g/cm$^{-3}$. A carbon film having a density almost equal to 2.19 g/cm$^{-3}$ was obtained using a polymer that includes the repeating unit shown by the general formula (2). The crystallinity is normally evaluated by wide-angle X-ray diffraction. However, when applying wide-angle X-ray diffraction to a highly crystalline carbon film, a significant error may occur when determining the crystal size and the interlayer spacing. On the other hand, the crystallinity can be accurately measured by measuring the density.

The graphite substrate 2 is also characterized in that the c-axis of the carbon crystal is highly oriented in the direction normal to the carbon film. The carbon film obtained by the above method exhibits a high degree of orientation as compared with a known carbon film.

A method that forms a thin film of a group 13 nitride on the graphite substrate 2 using the PED system 5 is described below.

The nitrogen gas pressure inside the chamber 10 is adjusted to about 1 to 20 mTorr using the gas supply section 14. The graphite substrate 2 is held using the substrate holder 31, and heated to about 200 to 850° C. using the heating mechanism provided in the substrate holder 31. The opening 16a of the ceramic tube 16 is disposed at a position apart from the target 22 by about 2 to 10 mm (preferably about 2 to 3 mm) using the moving mechanism.

Pulsed electron beams are then generated in the discharge tube 41 of the electron beam source 11. The pulsed electron beam accelerating voltage is preferably set to 10 to 20 kV, and the frequency is preferably set to about 1 to 20 Hz. The pulsed electron beams are guided by the ceramic tube 16, and discharged from the opening 16a. The pulsed electron beams discharged from the opening 16a are applied to the target 22. The pulsed electron beams are applied to the entire surface of the target 22 by continuously moving the opening 16a of the ceramic tube 16 over the entire surface of the target 22, for example.

When the pulsed electron beams are applied to the target 22, kinetic energy is supplied to the atoms or molecules of the target 22, so that the atoms or molecules are vaporized as a plume. The plume gradually changes in state while repeatedly colliding with the nitrogen gas, and approaches the graphite substrate 2. The plume that has reached the graphite substrate 2 is deposited on the graphite substrate 2 in a state in which lattice matching is most stable (i.e., group 13 nitride).

The group 13 nitride grows on the graphite substrate 2 in the shape of islands (three-dimensional islands). The island-like group 13 nitride further grows, and undergoes coalescence. The group 13 nitride then two-dimensionally grows in the thickness direction to form a thin film (semiconductor layer). A thin film is thus formed on the graphite substrate 2.

According to the first embodiment, since the semiconductor layer 4 is grown on the surface of the highly crystalline graphite substrate 2 that is formed of a heterocyclic polymer obtained by condensing an aromatic tetracarboxylic acid and an aromatic tetramine, the semiconductor layer 4 exhibits excellent crystallinity due to the excellent crystallinity of the graphite substrate 2 (i.e., the semiconductor layer 4 that exhibits excellent crystallinity can be obtained). The semiconductor substrate 1 that includes the semiconductor layer 4 that exhibits excellent crystallinity can thus be obtained.

Second Embodiment

A second embodiment of the invention is described below.

Figure 4:
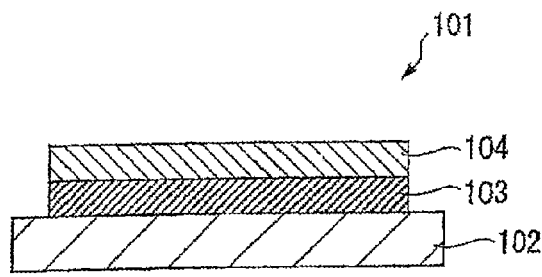
FIG. 4 is a view showing the configuration of a semiconductor substrate according to a second embodiment of the invention.

FIG. 4 is a view showing the configuration of a semiconductor substrate 101 according to the second embodiment.

As shown in FIG. 4, the semiconductor substrate 1 includes a graphite substrate 102, a buffer layer 103 that is stacked on the graphite substrate 102, and a semiconductor layer 104 that is stacked on the buffer layer 103. The semiconductor substrate 101 is provided in a light-emitting device, an electronic device, or the like. The graphite substrate 102 is formed of a heterocyclic polymer obtained by condensing an aromatic tetracarboxylic acid and an aromatic tetramine.

Figure 5:
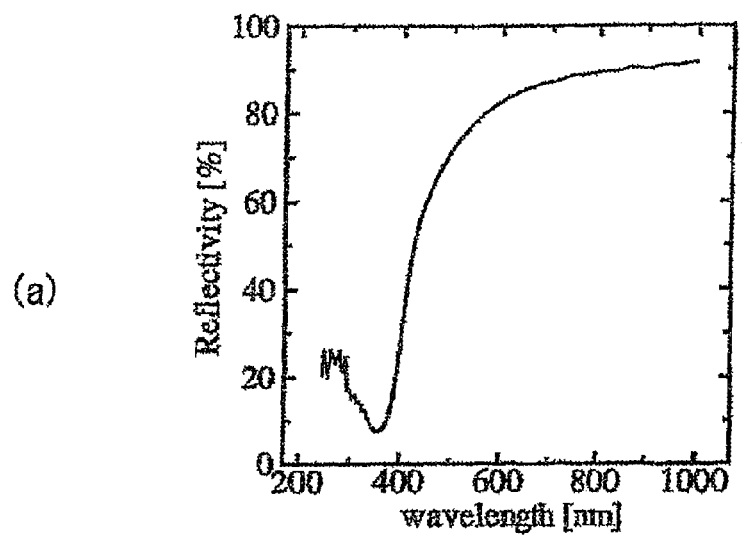
FIG. 5 is a view showing the reflection properties of zirconium nitride.

The buffer layer 103 is formed of zirconium nitride (ZrN (111)), and is interposed between the (0001) surface of the graphite substrate 2 and the semiconductor layer 104. FIG. 5(*a*) is a graph showing the reflectivity of zirconium nitride. In FIG. 5(*a*), the horizontal axis indicates wavelength, and the vertical axis indicates reflectivity. FIG. 5(*b*) shows the relationship between the reflectivity of zirconium nitride and the wavelength of light.

As shown in FIGS. 5(*a*) and 5(*b*), the reflectivity of zirconium nitride at a wavelength of 470 nm (within the wavelength range of blue light) is 65.6%. Therefore, when applying blue light to the buffer layer 103 formed of zirconium nitride, the buffer layer 103 reflects about 65% or more of the blue light.

Figure 6:
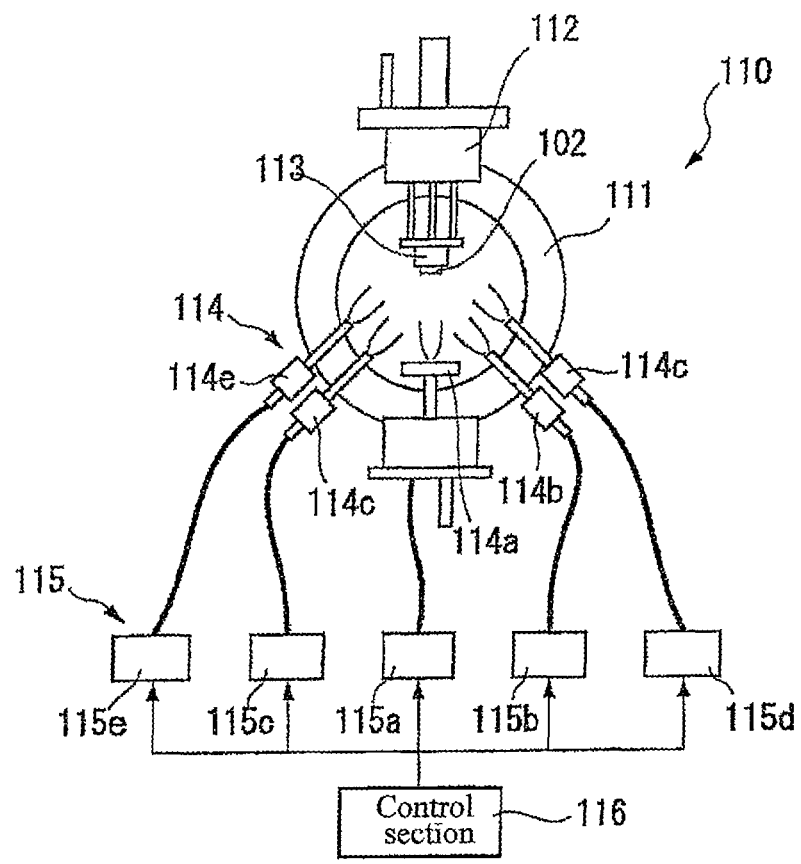
FIG. 6 is a view showing the configuration of a sputtering system according to the second embodiment.

FIG. 6 is a view showing the configuration of a sputtering system that is used to form the buffer layer 103. A sputtering system 110 shown in FIG. 6 includes a chamber 111, a substrate heating mechanism 112, a substrate holding section 113, a sputtering gun 114, a pulse power supply 115, and a control section 116.

The sputtering system 110 is configured so that the graphite substrate 102 can be heated using the substrate heating mechanism 112 in a state in which the graphite substrate 102 is held by the substrate holding section 113 provided in the chamber 111. Sputtering beams are applied to the graphite substrate 102 from a plurality of sputtering guns 114 in a state in which the graphite substrate 102 is held by the substrate holding section 113.

The plurality of sputtering guns 114 include a sputtering gun 114a that emits a Ga beam and a Ga alloy beam, a sputtering gun 114b that emits an Al beam and an Al alloy beam, a sputtering gun 114c that emits an In beam and an In alloy beam, a sputtering gun 114d that emits an Si beam and an Si alloy beam, and a sputtering gun 114e that emits an Hf beam and an Hf alloy beam. The type of metal beam emitted from each sputtering gun (114a to 114e) can be appropriately changed. For example, the sputtering gun may be configured to emit a Zr beam, an Mg beam, or the like.

Each sputtering gun 114 is respectively connected to the pulse power supply 115. The pulse power supply 115 applies a pulsed voltage to the sputtering gun 114. Pulse power supplies 115a to 115e are provided corresponding to the sputtering guns 114a to 114e, respectively. The output timing, the output period, the frequency, the amplitude, and the like of the pulsed voltage output from each pulse power supply (115a to 115e) are controlled by the control section 116 (e.g., control computer).

The semiconductor substrate 101 according to the second embodiment is produced as described below.

The graphite substrate 102 is formed in the same manner as described above in connection with the first embodiment. It is preferable to adjust the calcining conditions so that the graphite substrate 102 has almost the same coefficient of thermal expansion as that of the semiconductor layer 104 formed on the graphite substrate 102.

The buffer layer 103 is formed as follows. The buffer layer 103 may be formed by pulsed sputtering deposition (PSD) that applies a pulsed DC voltage between the substrate and the target, for example. It is effective to utilize PSD when forming a semiconductor thin film on the graphite substrate 102 that can be formed to have a large area.

Argon gas and nitrogen gas are supplied to the chamber 111. After the pressure inside the chamber 111 has increased to a given value due to the argon gas and the nitrogen gas, the graphite substrate 102 is held using the substrate holding section 113. The temperature around the graphite substrate 102 is then adjusted using the substrate heating mechanism 112. The pulse power supply 115 is then driven, so that the sputtering gun 114e emits an Hf beam toward the (0001) surface of the graphite substrate 102.

Hf atoms having high energy are supplied to the graphite substrate 102 when the pulsed voltage is applied to the sputtering gun 114e. Nitrogen radicals are present on the surface of the graphite substrate 102. A large amount of Hf atoms having high energy are supplied to the (0001) surface of the graphite substrate 102, so that the surface of the graphite substrate 102 becomes metal-rich.

The Hf atoms migrate to a stable lattice location in a metal-rich state. The Hf atoms that have migrated to a stable lattice location react with the nitrogen radicals that have been activated in the chamber 111 to form metal nitride (HfN) crystals. HfN that has a stable crystal structure is intermittently deposited each time the pulsed voltage is applied. The buffer layer 103 is thus formed on the (0001) surface of the graphite substrate 102. The semiconductor layer 104 is formed on the buffer layer 103 in the same manner as described above in connection with the first embodiment, for example.

According to the second embodiment, since the buffer layer 103 is grown on the surface of the highly crystalline graphite substrate 102 that is formed of a heterocyclic polymer obtained by condensing an aromatic tetracarboxylic acid and an aromatic tetramine, and the semiconductor layer 104 is grown on the surface of the buffer layer 103, the buffer layer 103 and the semiconductor layer 104 exhibit excellent crystallinity due to the excellent crystallinity of the graphite substrate 102 (i.e., the semiconductor layer 104 that exhibits excellent crystallinity can be obtained). The semiconductor substrate 101 that includes the semiconductor layer 104 that exhibits excellent crystallinity can thus be obtained.

Third Embodiment

A third embodiment of the invention is described below.

Figure 7:
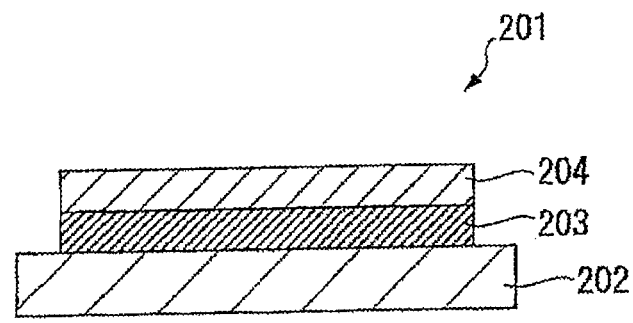
FIG. 7 is a view showing the configuration of a semiconductor substrate according to a third embodiment of the invention.

FIG. 7 is a view showing the configuration of a semiconductor substrate 201 according to the third embodiment.

As shown in FIG. 7, the semiconductor substrate 201 includes a graphite substrate 202, a buffer layer 203 that is stacked on the graphite substrate 202, and a semiconductor layer 204 that is stacked on the buffer layer 203. The semiconductor substrate 201 is provided in a light-emitting device, an electronic device, or the like. The graphite substrate 202 is formed of a heterocyclic polymer obtained by condensing an aromatic tetracarboxylic acid and an aromatic tetramine.

Figure 8:
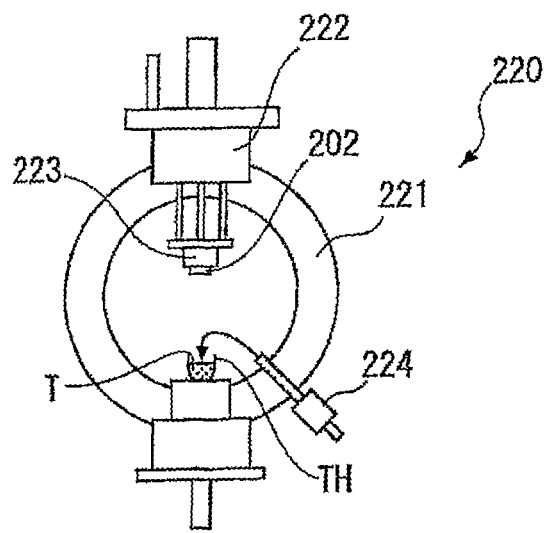
FIG. 8 is a view showing the configuration of a molecular beam epitaxy (MBE) system according to the third embodiment.

FIG. 8 is a view showing the configuration of a molecular beam epitaxy (MBE) system that is used to produce the semiconductor layer 204.

An MBE system 220 shown in FIG. 8 includes a chamber 221, a substrate heating mechanism 222, a substrate holding section 223, an electron gun 224, and a target holder TH.

The MBE system 220 is configured so that the graphite substrate 202 can be heated using the substrate heating mechanism 222 in a state in which the graphite substrate 202 is held by the substrate holding section 223 provided in the chamber 221. Electron beams are applied to a target T provided in the target holder TH from the electron gun 224 in a state in which the graphite substrate 202 is held by the substrate holding section 223. The chamber 221 is configured to be hermetically sealed. The chamber 221 can be depressurized using a turbo-molecular pump (not shown) or the like. The chamber 221 is maintained under vacuum using a turbo-molecular pump or the like.

The inner wall surface of the chamber 221 is provided with a liquid nitrogen shroud (not shown). The liquid nitrogen shroud causes a residual impurity gas present in the chamber 221 to be adsorbed on the wall surface of the chamber 221. The base pressure inside the chamber 221 can be set to about $1 \times 10^{-10}$ Torr, for example. A heat-resistant Ta crucible or the like may be used as the target holder. The target T provided in the target holder TH is a solid Si source or the like. The MBE system 220 is configured so that Si is vaporized by heating the solid Si source using electron beams emitted from the high-power electron gun. The vaporized Si adheres to the graphite substrate 2, so that an Si thin film is grown on the graphite substrate 202. The chamber 221 is provided with a reflection high-energy electron diffraction (RHEED) system so that the crystallinity of the substrate and the surface of the thin film can be observed.

The semiconductor substrate 201 according to the third embodiment is produced as described below.

The graphite substrate 202 is formed in the same manner as described above. It is preferable to adjust the calcining conditions so that the graphite substrate 202 has almost the same coefficient of thermal expansion as that of the semiconductor layer 204 formed on the graphite substrate 202.

The buffer layer 203 is formed on the graphite substrate 202 in the same manner as described above in connection with the second embodiment, for example. After forming the buffer layer 203, an Si thin film is grown on the buffer layer 203. An example in which the Si thin film is grown by MBE is described below. It is effective to utilize MBE when forming a semiconductor thin film on the graphite substrate 202 that can be formed to have a large area.

The chamber 221 is set to the base pressure using a turbo-molecular pump, and the graphite substrate 202 on which the buffer layer 203 is formed is held using the substrate holding section 223. The target T is provided in the target holder TH. The temperature around the graphite substrate 202 is then adjusted using the substrate heating mechanism 222. An electronic current that flows through the electron gun 224 is then adjusted to apply electron beams to the target T provided in the target holder TH. The target T is vaporized upon application of electron beams, and adheres to the buffer layer 203 formed on the graphite substrate 202. When the target T is an Si source, Si atoms adhere to the buffer layer 203, so that an Si thin film is grown on the buffer layer 203. The Si thin film is the semiconductor layer 204.

According to the third embodiment, since the buffer layer 203 is grown on the surface of the highly crystalline graphite substrate 202 that is formed of a heterocyclic polymer obtained by condensing an aromatic tetracarboxylic acid and an aromatic tetramine, and the silicon semiconductor layer 204 is grown on the surface of the buffer layer 203, the buffer layer 203 and the semiconductor layer 204 exhibit excellent crystallinity due to the excellent crystallinity of the graphite substrate 202 (i.e., the semiconductor layer 204 that exhibits excellent crystallinity can be obtained). The semiconductor substrate 201 that includes the semiconductor layer 204 that exhibits excellent crystallinity can thus be obtained.

Note that the technical scope of the invention is not limited to the above embodiments. It should be understood that various modifications may be appropriately made of the above embodiments without departing from the scope of the invention.

Figure 9:
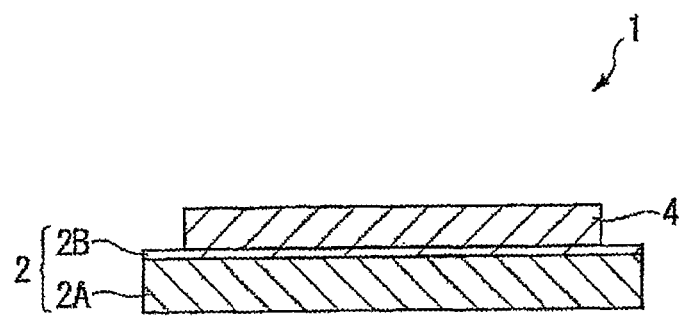
FIG. 9 is a view showing another configuration of a semiconductor substrate according to the invention.

Although the above embodiments have been described taking an example in which the graphite substrate 2, 102, or 202 that is entirely formed of graphite is used as the graphite layer, the graphite substrate 2 may have a configuration in which a graphite layer 2B is formed on the upper side of a base 2A (see FIG. 9).

In this case, the base 2A is preferably formed of a material that differs from a heterocyclic polymer obtained by condensing an aromatic tetracarboxylic acid and an aromatic tetramine, and is not melted at the graphite calcining temperature. Examples of such a material include a heat-resistant organic compound and the like. The graphite substrate 2 may be formed by applying the polymer liquid 7 (refer to the first embodiment) to the base 2A in the shape of a thin film, and calcining the polymer liquid 7 and the base 2A, for example.

A heterocyclic polymer obtained by condensing an aromatic tetracarboxylic acid and an aromatic tetramine is relatively expensive. When the graphite substrate 2 includes the base 2A and the graphite layer 2B, a material that differs from the heterocyclic polymer is mainly used to form the graphite substrate 2. Therefore, a reduction in cost can be achieved by utilizing a material cheaper than the heterocyclic polymer as the material for forming the base 2A.

Although the above embodiments have been described taking an example in which the buffer layer is formed by pulsed sputtering, and the semiconductor layer is formed by PED or MBE, the buffer layer and the semiconductor layer may be formed by pulsed excitation deposition (PXD), metal organic chemical vapor deposition, molecular beam epitaxy, CVD, or the like.

Although the above embodiments have been described taking an example in which the HfN(111) buffer layer is formed on the graphite substrate, a ZrN(111) buffer layer or the like may be formed on the graphite substrate. A plurality of buffer layers may be stacked on the graphite substrate (e.g., GaN layer/AlN layer/graphite substrate).

The semiconductor substrate (1, 101, and 201) according to the embodiments of the invention may be used for a wide range of applications (e.g., semiconductor devices (e.g., light-emitting diode and semiconductor laser) formed on an amorphous substrate). The semiconductor substrate may also be used for a transparent circuit that is formed on an amorphous substrate and utilizes such a semiconductor device.

The semiconductor substrate may be applied as a transparent electrode of flat panel displays, solar cells, touch panels, and the like. The semiconductor substrate may also be applied to an electromagnetic shield used for an antireflective film, a film that prevents adhesion of dust due to static electricity, an antistatic film, solar reflective glass, or UV-cut glass.

Further examples of applications include an electrode of dye-sensitized solar cells, a transparent electrode of display panels, organic EL panels, light-emitting devices, light-emitting diodes (LED), white LED, and lasers, lighting devices, communication devices, and a means that allows only light within a specific wavelength range to pass through.

Examples of specific applications include a transparent conductive film of liquid crystal displays (LCD), a transparent conductive film of color filters, a transparent conductive film of electroluminescence (EL) displays, a transparent conductive film of plasma display panels (PDP), a PDP optical filter, a transparent conductive film that blocks electromagnetic waves, a transparent conductive film that blocks near-infrared rays, a transparent conductive film that prevents surface reflection, a transparent conductive film that improves color reproducibility, a transparent conductive film that prevents breakage, an optical filter, a touch panel, a resistive touch panel, an electromagnetic induction touch panel, an ultrasonic touch panel, an optical touch panel, a capacitive touch panel, a resistive touch panel for portable information terminals, an inner touch panel, a solar cell, an amorphous silicon (a-Si) solar cell, a microcrystalline silicon thin-film solar cell, a CIGS solar cell, a dye-sensitized solar cell (DSC), an antistatic transparent conductive material for electronic parts, an antistatic transparent conductive material, a switchable material, a switchable mirror, a heating element (sheet heater and electrical heating glass), and an electromagnetic shield glass. The invention may also be applied to various electronic instruments (e.g., mobile phone, information terminal, computer, and OA equipment) provided with such a material.

EXAMPLES

The invention is further described below by way of examples.

Example 1

Production of Semiconductor Substrate

A BBL polymer was used as a heterocyclic polymer obtained by condensing an aromatic tetracarboxylic acid and an aromatic tetramine. A carbon film was formed by pyrolyzing the BBL polymer. After cleaning the surface of the carbon film by vacuum annealing, a GaN thin film was grown by PXD. $N_2$ gas was introduced as a nitrogen source, and the GaN thin film was grown at 700 to 800° C. The thin film was evaluated by X-ray diffraction (XRD) analysis, room temperature photoluminescence (PL) analysis, observation using a scanning electron microscope (SEM), and electron backscatter diffraction (EBSD) analysis.

Figure 10:
FIG. 10 is a view showing the properties of a graphite substrate according to Example 1.
Figure 11:
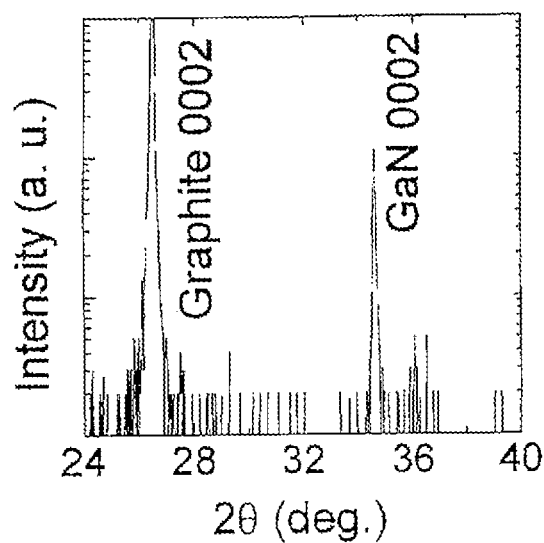
FIG. 11 is a view showing the properties of a semiconductor layer according to Example 1.
Figure 12:
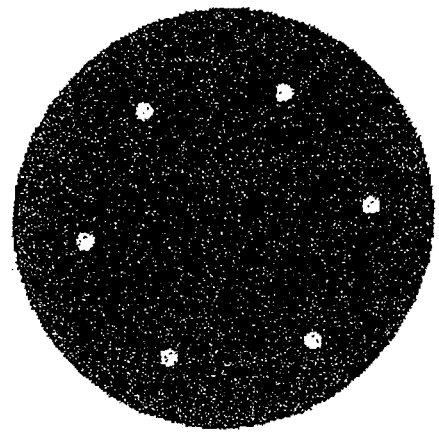
FIG. 12 is a view showing the properties of a semiconductor layer according to Example 1.
Figure 13:
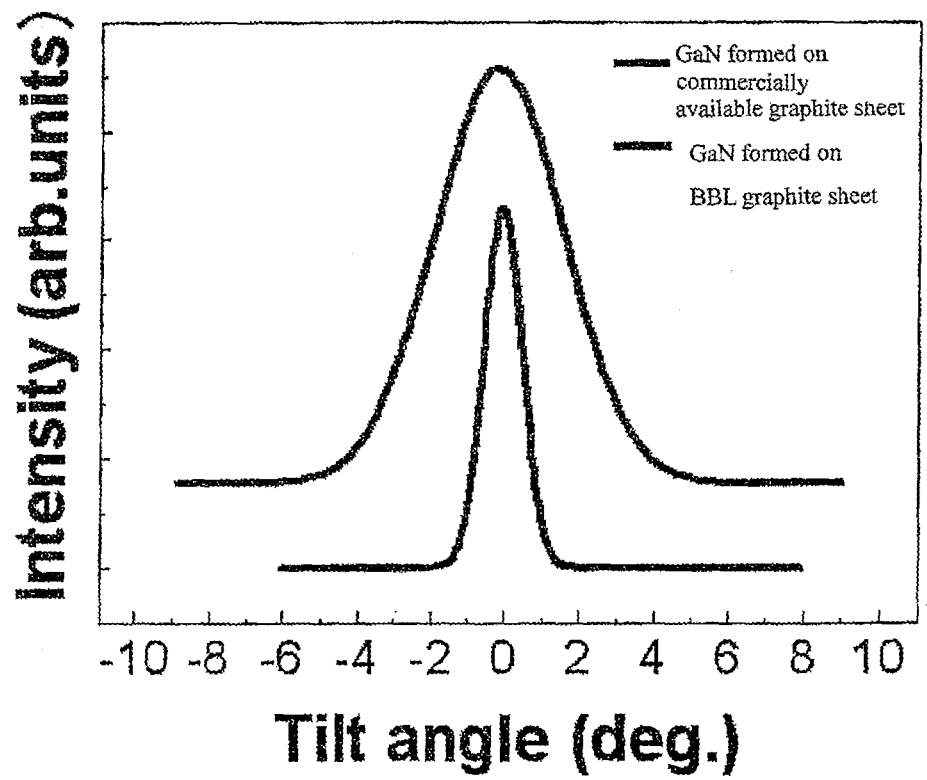
FIG. 13 is a view showing the properties of a semiconductor layer according to Example 1.

The carbon film formed by pyrolyzing the BBL polymer was also subjected to XRD analysis and AFM observation after vacuum annealing. It was confirmed that the carbon film had an exposed (0001) surface, and contained a high-quality crystal having a flat terrace at an atomic level (see FIG. 10). After the GaN thin film was grown on the graphite sheet, the (0002) diffraction peak of the GaN thin film was clearly observed by XRD analysis (see FIG. 11). As shown in FIGS. 12 and 13, it was confirmed by EBSD analysis that the GaN thin film was epitaxially grown on the carbon film (i.e., a GaN thin film that exhibits high crystallinity could be grown). In FIG. 13, the lower peak indicates the peak of the GaN thin film formed on the BBL graphite sheet, and the upper peak indicates the peak of a GaN thin film formed on a commercially available graphite sheet.

Example 2

Production of Polymer

A four-necked flask (200 ml) equipped with a mechanical stirrer, an argon gas supply tube, a discharge pipe, and a thermometer was charged with 100 g of polyphosphoric acid (PPA) (orthophosphoric acid equivalent: 115%). After removing dissolved oxygen by bubbling with argon gas, 12 mmol of 1,2,4,5-benzenetetramine hydrochloride was dissolved in the polyphosphoric acid. After the addition of 12 mmol of 1,4,5,8-naphthalenetetracarboxylic acid, the mixture was stirred at 200° C. for 24 hours to obtain a PPA solution of a polymer.

The PPA solution was added to a large quantity of water to coagulate the polymer. The polymer was filtered off, sequentially washed with water and methanol (MeOH), and dried at room temperature under reduced pressure to obtain a crude polymer. PPA remaining in the crude polymer was then removed. Specifically, the crude polymer was dissolved in methanesulfonic acid (MSA). The solution was added to a large quantity of water to coagulate the polymer. The polymer was sequentially washed with water, N,N-dimethylacetamide (DMAc), and MeOH, and dried at 240° C. for 24 hours under reduced pressure to obtain a purified polymer.

The intrinsic viscosity ($\eta$) of the polymer (MSA solution having a concentration of 0.15 gdl$^{-1}$) was measured at 30° C. using an Ostwald viscometer (manufactured by Sibata Scientific Technology Ltd.). The polymer had an intrinsic viscosity of 2.5 to 3.0 dlg$^{-1}$.

Production of Polymer Film

A viscous solution obtained by dissolving 0.3 g of the polymer in 7 ml of MSA was spread on a flat glass petri dish (inner diameter: 70 mm). The petri dish was horizontally placed in a flat bottom separable flask (500 ml) placed in a mantle heater. After depressurizing the separable flask using a rotary pump, the solvent was removed by heating the separable flask to 200° C. stepwise to obtain a polymer film.

The polymer film could be easily removed from the petri dish. MSA remaining in the polymer film was then removed. Specifically, the polymer film was immersed in an MeOH solution of triethylamine at room temperature for 12 hours, washed with MeOH, and dried under reduced pressure. The thickness of the resulting polymer film was about 50 µm. The polymer film was flexible, and could be cut into a desired shape.

Production of Carbon Film

The polymer film was carbonized by the following two-stage heat treatment.

The polymer film was cut into a given shape, interposed between graphite plates, and placed in an electric furnace provided with a silicon carbide heater. The polymer film was heated at 2° C./min$^{-1}$ while circulating nitrogen gas through the electric furnace at a flow rate of 250 ml/min$^{-1}$, and held at 1500° C. for 1 hour to obtain a carbon film.

The carbon film was interposed between graphite plates, and placed in an electric furnace (manufactured by Shinsei Electric Furnace Works Co. Ltd.) provided with a graphite heater. The carbon film was heated at 5° C./min$^{-1}$ while circulating argon gas through the electric furnace at a flow rate of 2000 ml/min$^{-1}$, and held at 2800° C. for 1 hour.

Example 3

Properties of Graphite Substrate Obtained Using Binaphthyltetracarboxylic Acid-Biphenyltetramine (BNTCA-BPTA) Polymer as Starting Material FIGS. 14 to 17 show the properties of a graphite layer that was formed by spin-coating a BNTCA-BPTA polymer onto graphite.

Figure 14:
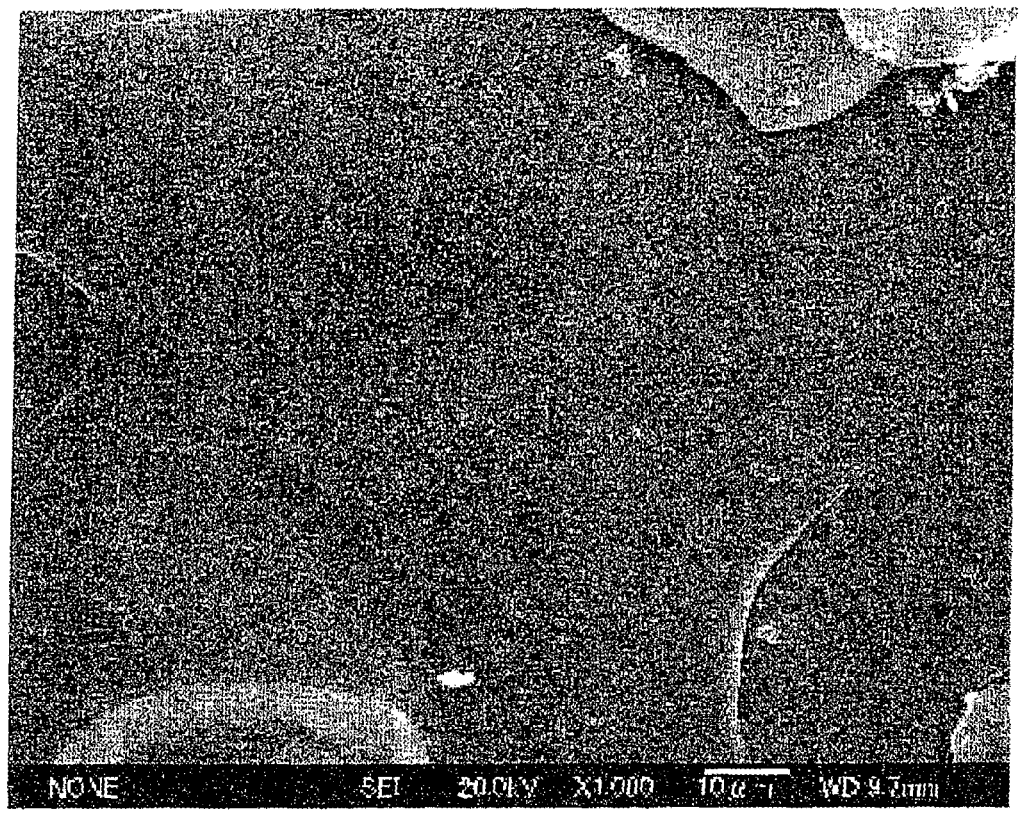
FIG. 14 is a view showing the properties of a graphite substrate according to Example 3.
Figure 15:
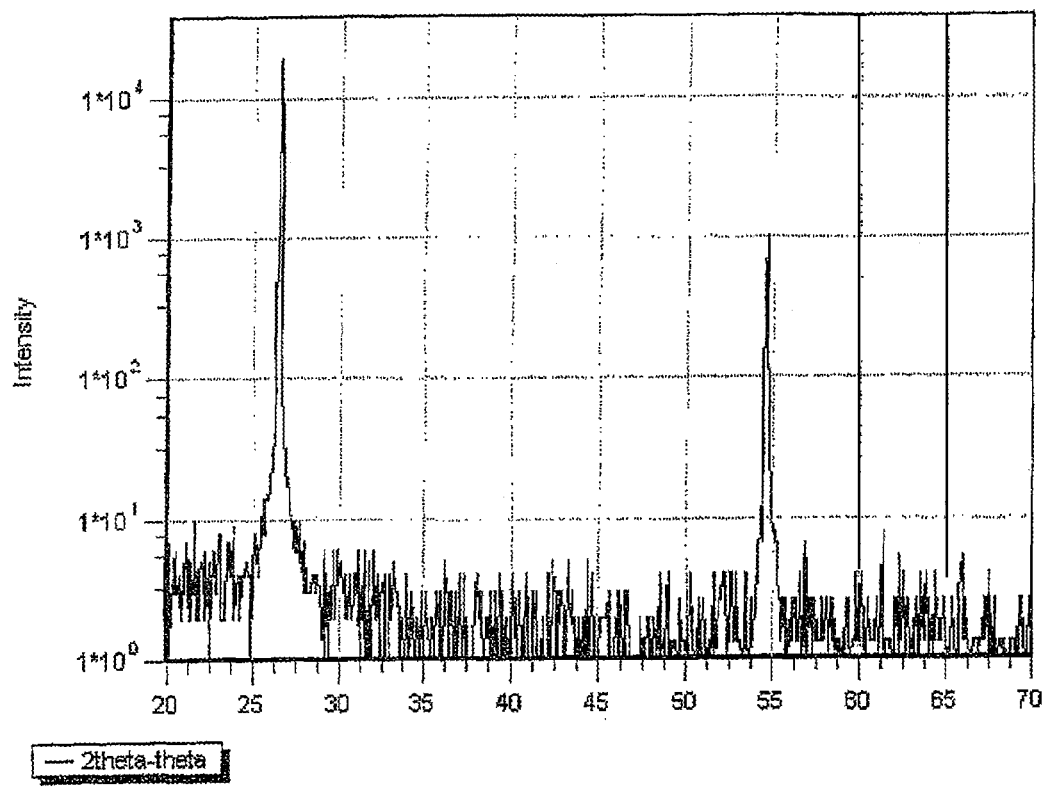
FIG. 15 is a view showing the properties of a graphite substrate according to Example 3.
Figure 16:
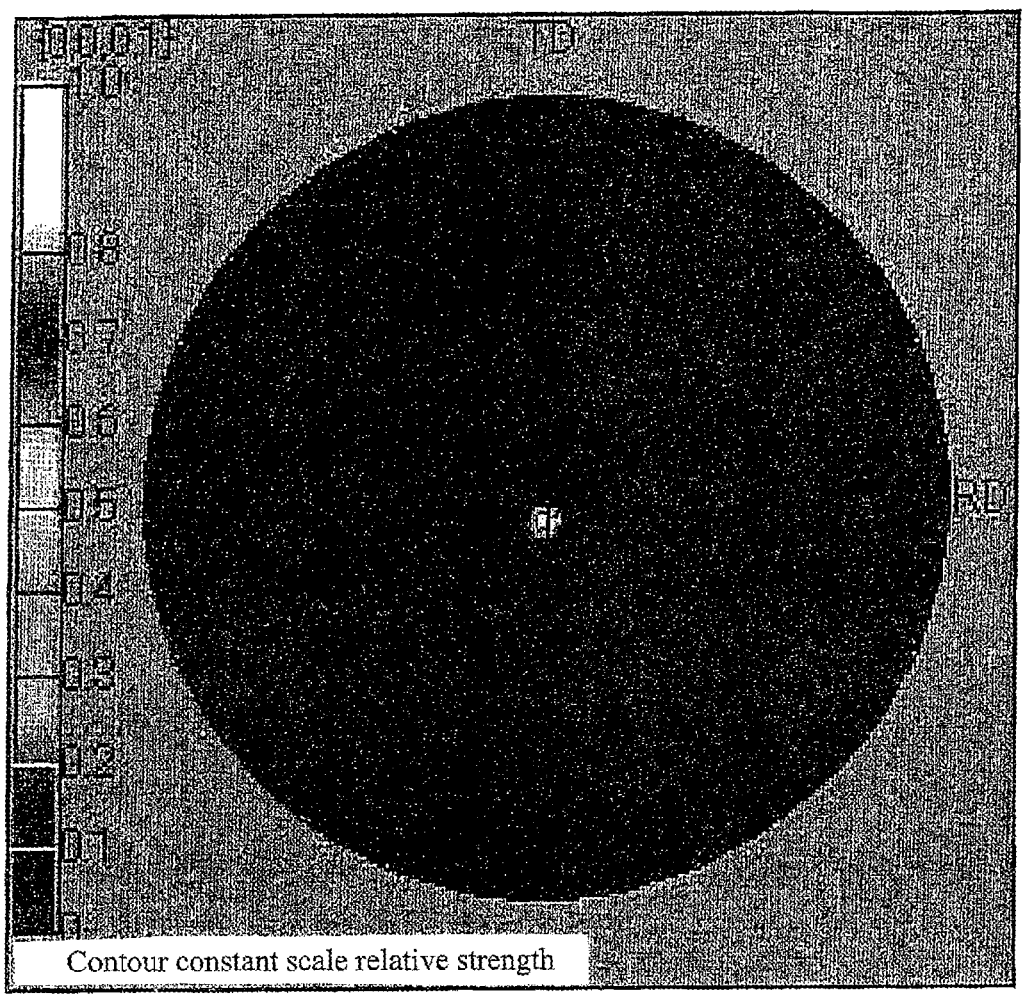
FIG. 16 is a view showing the properties of a graphite substrate according to Example 3.
Figure 17:
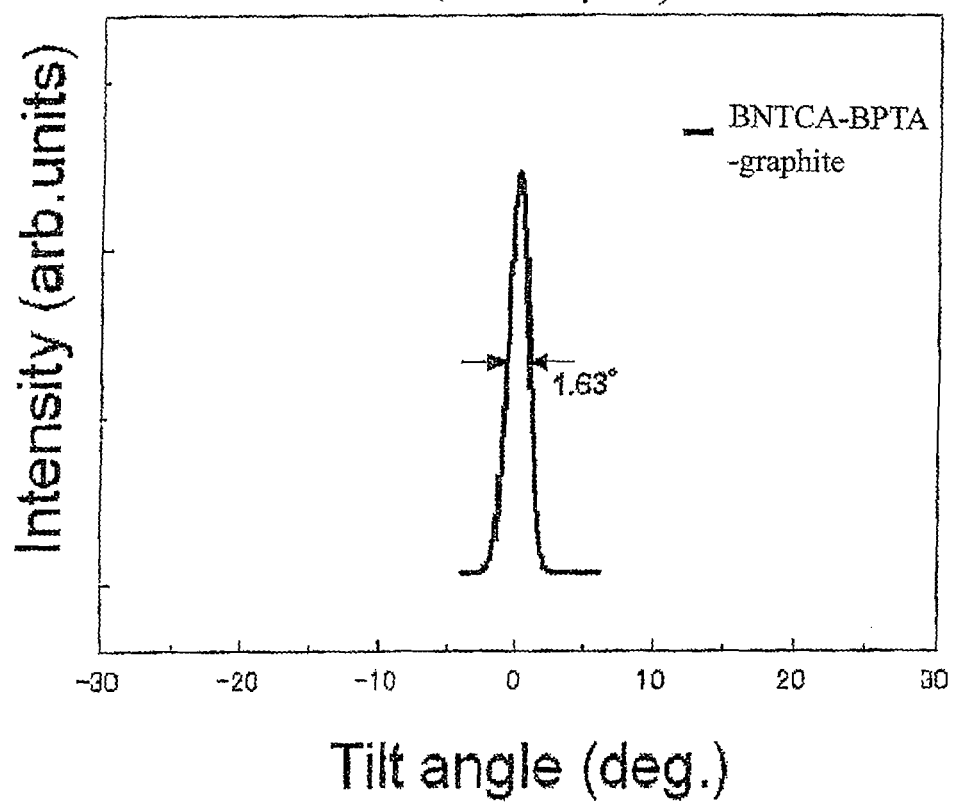
FIG. 17 is a view showing the properties of a graphite substrate according to Example 3.

As shown in FIG. 14 (surface SEM image), the surface of the graphite layer was flat. As shown in FIG. 15 (XRD analysis results) and FIG. 16 (EBSD analysis results), the (0001) diffraction peak of the crystals of the graphite layer was clearly observed. As shown in FIG. 17 (tilt angle distribution), the half-width of the peak was 1.63°. The grain size of the crystals of the graphite layer was about 10 µm.

LIST OF REFERENCE NUMERALS 1, 101, 201: semiconductor substrate, 2, 102, 202: graphite substrate, 103, 203: buffer layer, 4, 104, 204: semiconductor layer

The invention claimed is:

1. A semiconductor substrate comprising:
   a substrate that includes a graphite layer, the graphite layer forming a surface of the substrate, and being formed of a benzimidazobenzophenanthroline ladder polymer or a binaphthyltetracarboxylic acid-biphenyltetramine polymer; and
   a semiconductor layer that is grown on a surface of the graphite layer.

2. A semiconductor substrate comprising:
   a substrate that includes a graphite layer, the graphite layer forming a surface of the substrate, and being formed of a benzimidazobenzophenanthroline ladder polymer or a binaphthyltetracarboxylic acid-biphenyltetramine polymer;
   a buffer layer that is grown on a surface of the graphite layer; and
   a semiconductor layer that is grown on a surface of the buffer layer.

3. The semiconductor substrate according to claim 2, wherein the buffer layer includes at least one of HfN, ZrN, and AlN.

4. The semiconductor substrate according to claim 2, wherein the buffer layer includes a plurality of layers.

5. The semiconductor substrate according to claim 1, wherein the semiconductor layer is formed of a semiconductor that includes silicon or a group 13 nitride.

6. The semiconductor substrate according to claim 1, wherein the graphite layer has a (0001) surface, and the semiconductor layer is grown on the (0001) surface.

7. The semiconductor substrate according to claim 1, wherein the substrate includes a base that includes an organic compound that differs from the heterocyclic polymer, and the graphite layer that is provided on the base.

8. A method of producing a semiconductor substrate comprising causing a semiconductor layer to grow on a surface of a graphite layer that forms a surface of a substrate, the graphite layer being formed of a benzimidazobenzophenanthroline ladder polymer or a binaphthyltetracarboxylic acid-biphenyltetramine polymer.

9. A method of producing a semiconductor substrate comprising causing a buffer layer to grow on a surface of a graphite layer that forms a surface of a substrate, and causing a semiconductor layer to grow on a surface of the buffer layer, the graphite layer being formed of a benzimidazobenzophenanthroline ladder polymer or a binaphthyltetracarboxylic acid-biphenyltetramine polymer.

10. The method according to claim 9, comprising causing a layer that includes at least one of HfN, ZrN, and AlN to grow as the buffer layer.

11. The method according to claim 9, comprising forming a plurality of layers as the buffer layer.

12. The method according to claim 8, comprising causing a semiconductor layer that includes silicon or a group 13 nitride to grow as the semiconductor layer.

13. The method according to claim 8, wherein the graphite layer has a (0001) surface, and the method comprises causing the semiconductor layer to grow on the (0001) surface.

14. The method according to claim 8, comprising forming the graphite layer on a base that is formed of an organic compound that differs from the heterocyclic polymer to obtain the substrate.

15. The method according to claim 14, comprising dissolving the heterocyclic polymer in a solvent to obtain a solution of the heterocyclic polymer, applying the solution to the base to form a thin film, and heating the thin film and the base at 2000 to 3000° C. to obtain the substrate.

16. The method according to claim 8, comprising forming a layer of the heterocyclic polymer on a free-standing base, and separating the layer of the heterocyclic polymer from the free-standing base to obtain the graphite layer.

17. The method according to claim 8, comprising forming the graphite layer so that the graphite layer has a coefficient of thermal expansion corresponding to a coefficient of thermal expansion of the layer that is grown on the surface of the graphite layer.

18. A semiconductor growth substrate comprising a graphite layer that forms a surface of the semiconductor growth substrate, the graphite layer being formed of a benzimidazobenzophenanthroline ladder polymer or a binaphthyltetracarboxylic acid-biphenyltetramine polymer.

19. The semiconductor growth substrate according to claim 18, wherein the graphite layer has a (0001) surface.

20. The semiconductor growth substrate according to claim 18, comprising forming a base that is formed of an organic compound that differs from the heterocyclic polymer, the graphite layer being formed on the base.

21. A method of producing a semiconductor growth substrate comprising forming a graphite layer on a base, the graphite layer being formed of a benzimidazobenzophenanthroline ladder polymer or a binaphthyltetracarboxylic acid-biphenyltetramine polymer, and the base being formed of an organic compound that differs from the benzimidazobenzophenanthroline ladder polymer or the binaphthyltetracarboxylic acid-biphenyltetramine polymer, respectively.

22. The method according to claim 21, comprising dissolving the heterocyclic polymer in a solvent to obtain a solution of the heterocyclic polymer, applying the solution to the base to form a thin film, and heating the thin film and the base at 2000 to 3000° C. to obtain the semiconductor growth substrate.

23. A method of producing a semiconductor growth substrate comprising forming a layer of a benzimidazobenzophenanthroline ladder polymer or a binaphthyltetracarboxylic acid-biphenyltetramine polymer on a free-standing base, and separating the layer of the respective benzimidazobenzophenanthroline ladder polymer or binaphthyltetracarboxylic acid-biphenyltetramine polymer from the free-standing base to obtain a graphite layer.

24. The method according to claim 21, comprising forming the graphite layer so that the graphite layer has a coefficient of thermal expansion corresponding to a coefficient of thermal expansion of a layer that is grown on a surface of the graphite layer.

25. A semiconductor device comprising the semiconductor substrate according to claim 1.

26. A light-emitting device comprising the semiconductor device according to claim 25.

27. A display panel comprising the light-emitting device according to claim 26.

28. An electronic device comprising the semiconductor device according to claim 25.

29. A solar cell device comprising the semiconductor substrate according to claim 1.

\* \* \* \* \*